United States Patent [19]

Hamakawa et al.

[11] 4,388,482
[45] Jun. 14, 1983

[54] HIGH-VOLTAGE PHOTOVOLTAIC CELL HAVING A HETEROJUNCTION OF AMORPHOUS SEMICONDUCTOR AND AMORPHOUS SILICON

[76] Inventors: Yoshihiro Hamakawa, 3-17-4, Minami-Hanayashiki Kawanishi, Hyogo; Yoshihisa Tawada, 14-39, Oike-Miyamadai, Kita-Ku, Kobe, Hyogo, both of Japan

[21] Appl. No.: 266,064

[22] Filed: May 19, 1981

[30] Foreign Application Priority Data

Jan. 29, 1981 [JP] Japan .................................. 56-12313
Feb. 17, 1981 [JP] Japan .................................. 56-22690
Apr. 30, 1981 [JP] Japan .................................. 56-66689

[51] Int. Cl.$^3$ ............................................ H01L 31/06
[52] U.S. Cl. ........................................ 136/258; 357/2; 357/30
[58] Field of Search ............. 136/258 AM; 357/2, 30

[56] References Cited

U.S. PATENT DOCUMENTS 4,109,271  8/1978  Pankove ............................... 357/30

Primary Examiner—Aaron Weisstuch
Attorney, Agent, or Firm—Wenderoth, Lind & Ponack

[57] ABSTRACT

A p-i-n amorphous silicon photovoltaic cell of improved conversion efficiency is obtained by incorporating, as either the p or n type side of the cell exposed to the incident light, an amorphous semiconductor which satisfies the requirements that the optical band gap, Eg.opt, be not less than about 1.85 eV, the electric conductivity be not less than about $10^{-8}$ $(\Omega.cm)^{-1}$ the p-i-n junction diffusion potential, Vd, be not less than about 1.1 volts, and be formed of a substance represented by one of the general formulas, $a\text{-}Si_{1-x}C_x$ and $a\text{-}Si_{1-y}N_y$.

13 Claims, 4 Drawing Figures

HIGH-VOLTAGE PHOTOVOLTAIC CELL HAVING A HETEROJUNCTION OF AMORPHOUS SEMICONDUCTOR AND AMORPHOUS SILICON

BACKGROUND OF THE INVENTION

1. Field of the Invention

This invention relates to a photovoltaic cell having a heterojunction of an amorphous semiconductor and amorphous silicon.

2. Description of the Prior Art

Amorphous silicon is obtained by the plasma decomposition of silane ($SiH_4$). W. E. Spear et al. discovered in 1976 that the conductivity of amorphous silicon could be notably altered by substitutional doping with $PH_3$ or $B_2H_6$. D. E. Carlson et al. manufactured a solar cell using amorphous silicon in 1976. These achievements have drawn attention to amorphous silicon and have given an impetus to researches devoted to improvement of the conversion efficiency of thin-film solar cells using amorphous silicon.

The researches have so far led to development of thin-film amorphous silicon photovoltaic cells of the Schottky barrier type, pin type, MIS type and heterojunction type. The first three of these types promise to provide highly efficient solar cells. The Schottky barrier type photovoltaic cell made by D. E. Carlson et al. in 1977 showed a conversion efficiency of 5.5%, the MIS type photovoltaic cell made by J. I. B. Wilson et al. in 1978 a conversion efficiency of 4.8% and the pin type photovoltaic cell made by Yoshihiro Hamakawa in 1978 a conversion efficiency of 4.5% respectively.

In the case of the pin junction type solar cell, the p or n type amorphous silicon has a short carrier lifetime and, therefore, fails to provide an effective carrier and the p layer which has non-radiative recombination centers suffers from heavy absorption loss of light because it has a higher light absorption coefficient than the i layer.

The inverted pin type photovoltaic cell has been proposed with a view to overcoming these drawbacks. This cell is constructed so that the light impinges on the n type amorphous silicon side. Since this cell has a smaller light absorption coefficient than the p type, it is believed to be more advantageous, though slightly. Nevertheless this n type amorphous silicon is no better than the p type in the sense that it similarly suffers from absorption loss of light.

The inventors made a diligent study devoted to improvement of the conversion efficiency of the pin type photovoltaic cell. They consequenly have found that the short circuit current and the open circuit voltage of the pin junction type photovoltaic cell are greatly improved by using in either the p or n layer of the cell exposed to incident light an amorphous semiconductor having an optical band gap of not less than about 1.85 eV, an electric conductivity of not less than about $10^{-8}$ $(\Omega.cm)^{-1}$ at 20° C. and a diffusion potential, Vd, (exhibited in the pin junction) of not less than about 1.1 volts.

The photovoltaic cell of this invention is useful as a photo-electromotive cell in solar cells, photoswitches and the like. Now, the invention will be described in detail below.

DETAILED DESCRIPTION OF THE INVENTION

The amorphous silicon of this invention is obtained by subjecting a mixed gas consisting of silane ($SiH_4$) or a derivative thereof, silane fluoride or a derivative thereof, or a mixture thereof and an inert gas such as hydrogen, argon diluted with hydrogen or helium to radio-frequency glow decomposition or DC glow discharge decomposition by the capacitive or inductive coupling method. The concentration of silane in the mixed gas generally is in the range of from 0.5 to 50%, preferably in the range of from 1 to 20%.

The substrate is desired to have a working temperature in the range of from 200° to 300° C. It comprises a glass sheet having a transparent electrode (such as of ITO and $SnO_2$) vacuum deposited thereon, a polymer film, or a metal sheet and having all other component layers indispensable to the construction of a solar cell.

Figures 1A, 1B:
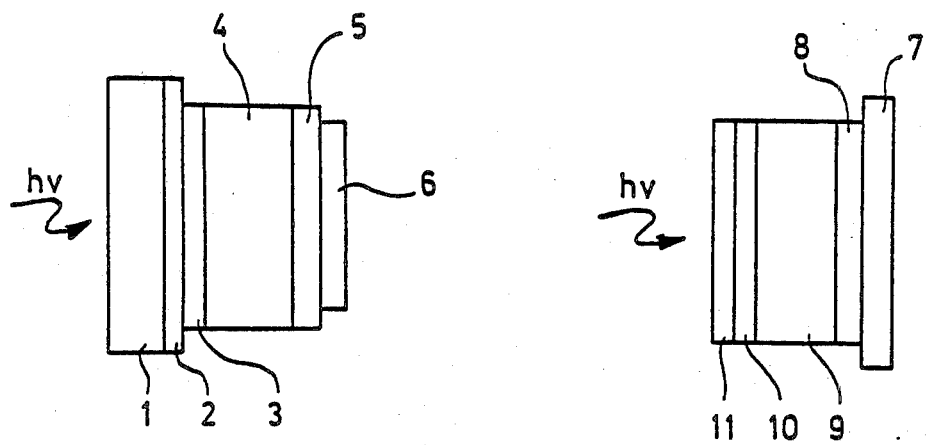
FIG. 1(a) is a structural diagram illustrating a photovoltaic cell of the type wherein the light impinges on the p layer side. In the diagram, 1 denotes a glass substrate, 2 a transparent electrode, 3 a p type amorphous semiconductor layer, 4 an i type a-Si layer, 5 an n type semiconductor layer (such as n type a-Si) and 6 an electrode.
FIG. 1(b) is a structural diagram illustrating a photovoltaic cell of the type wherein the light impinges on the n layer side. In the diagram, 7 denotes an electrode substrate, 8 a p type a-Si layer, 9 an i type a-Si layer, 10 an n type amorphous semiconductor layer and 11 a transparent electrode.

Typical examples of the basic construction of a solar cell as shown in FIGS. 1(a), (b). Illustrated in (a) is the type wherein the light impinges on the p side. This type has a construction of Glass - transparent electrode - p - i - n - Al, for example. Illustrated in (b) is the type wherein the light impinges on the n side. This type has a construction of stainless steel - p - i - n - transparent electrode. Optionally, other constructions may be formed by interposing a thin insulation layer or a thin metal layer between the p layer and the transparent electrode. Any construction suffices so far as the p-i-n junction is included as the basic component.

The p-i-n junction is constructed by forming an i layer of intrinsic amorphous silicon (hereinafter referred to as i type a-Si) obtained by the glow discharge decomposition of silane or a derivative thereof, silane fluoride or a derivative thereof or a mixture thereof and possessed of a carrier lifetime of not less than about $10^{-7}$ second, localized density states of not more than about $10^{17}$ $cm^{-3}eV^{-1}$, and a mobility of not less than $10^{-3}$ $cm^2/V$ and by joining p and n type doped semiconductors to the i layer. The construction contemplated by this invention is characterized by using, as either the p or n layer, on which the light impinges, an amorphous semiconductor having an optical band gap of not less than about 1.85 eV, an electric conductivity of not less than about $10^{-8}$ $(\Omega.cm)^{-1}$ at 20° C. and a diffusion potential, Vd, (exhibited in the p-i-n junction) of not less than about 1.1 volts. Optionally, p or n type amorphous semiconductors having the above properties may be used in each of the p and n layers. In the case where only one such amorphous semiconductor layer having the above properties is the p-type doped layer this layer may contain an element of Group III of the Periodic Table of Elements, e.g., when a-Si (as in the i-type layer) or an element of Group V of the same table when a-Si is doped to produce an n type layer.

The amorphous semiconductor of this invention is made of amorphous silicon carbide or amorphous silicon nitride represented by the general formula, a-$Si_{1-x}C_x$ or a-$Si_{1-y}N_y$. These compounds are obtained by subjecting a hydrogen or fluorine compound of silicon and a hydrogen or fluorine compound of carbon or a hydrogen-nitrogen compound, such as $NH_3$ gas, hydrazine, etc. to glow discharge decomposition.

Hydrogen and fluorine play an important role in amorphous silicon carbide. They are considered to act as terminators for dangling bonds in amorphous silicon obtained by the glow discharge decomposition of silane or silane fluoride. The concentration of hydrogen and/or fluorine in a film of amorphous silicon carbide depends largely on the substrate temperature, and other conditions of manufacture. According to this invention, the film contains about 3 to 30 atom % of hydrogen and/or fluorine, since the substrate temperature is preferably in the range of 200° C. to 350° C.

Further details on the amorphous semiconductors are found in the applicants' prior patent applications; Japanese Patent application No. 012,313/1981 covering a-$Si_{1-x}C_x$ and Japanese Patent application No. 022,690/1981 covering a-$Si_{1-y}N_y$ respectively. It should be noted that any amorphous semiconductor may be used on condition that it be possessed of an optical band gap of not less than about 1.85 eV, an electric conductivity of not less than about $10^{-8}$ $(\Omega.cm)^{-1}$, usually not more than $10^{\circ}$ $(\Omega.cm)^{-1}$ at 20° C. and a diffusion potential, Vd, (exhibited in the pin junction) of not less than about 1.1 volts.

Figure 2:
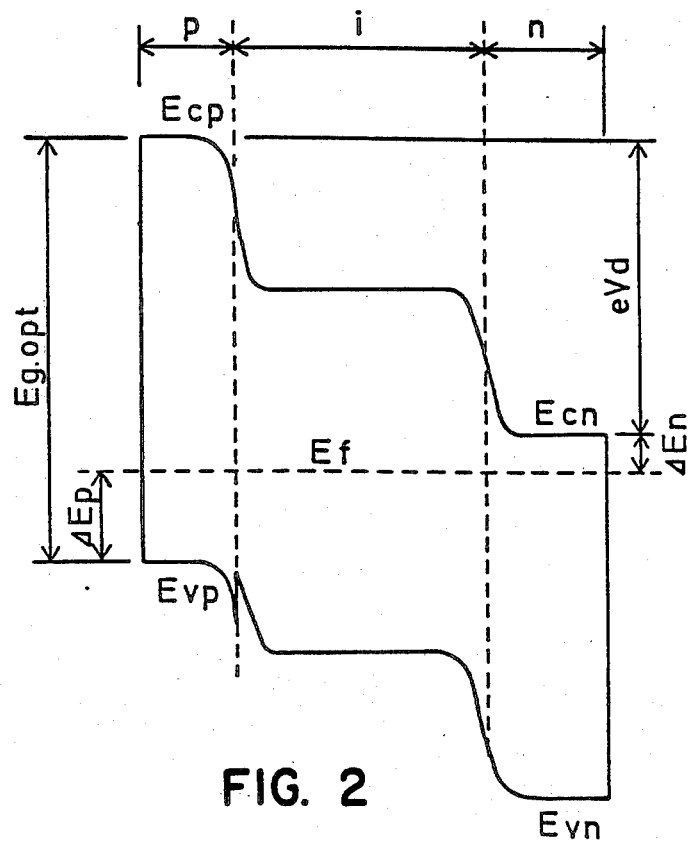
FIG. 2 is a diagram representing an energy band profile of the p-i-n heterojunction photovoltaic cell of this invention.

The amorphous semiconductor of the foregoing description has a large optical band gap and exhibits a very high open voltage, Voc, even though the semiconductor, when used as the window material for the pin junction photovoltaic cell, naturally has a possibility of increasing the short-circuit current, Jsc. It has been found that in the photovoltaic cell of this invention, there exists a correlation between the diffusion potential, Vd and the open circuit voltage of the cell as depicted by the band profile of FIG. 2. Although the diffusion potential, Vd, in the case of this invention exceeds about 1.1 volts, the trend of the relation is nearly constant without reference to the kind of the amorphous semiconductor to be used on the side exposed to the incident light. This diffusion potential is the difference obtained by subtracting the Fermi level, $E_f$, of the p, n doped layers from the optical band gap, Eg.opt, of the amorphous semiconductor on the side exposed to the light. Let Ecn stand for the energy level of the conduction band on the n side and Evp for the energy level of the valence band on the p side, and the activation energies $\Delta Ep$ and $\Delta En$ can be determined based on the dependency of electric conductivity on temperature as shown in FIG. 2. Since $\Delta Ep = Ef - Evp$ holds for the p type and $\Delta En = Ecn - Ef$ for the n type, there ensues $eVd = Eg.opt - (\Delta Ep + \Delta En)$. In the case of the incidence of light which occurs on the n side, the diffusion potential is similarly obtained by subtracting the Fermi level, Ef, of the p, n layers from the optical band gap, Eg.opt, of the n type amorphous semiconductor.

This invention requires the optical band gap, Eg.opt, to be at least about 1.85 eV and the diffusion potential, Vd, to be at least about 1.1 volts. By incorporating an amorphous semiconductor which satisfies this requirement, the heterojunction photovoltaic cell provides a great improvement in short-circuit current, Jsc, and open circuit voltage, Voc.

This invention further requires the electric conductivity to be at least $10^{-8} (\Omega.cm)^{-1}$ at room temperature. The reason for this lower limit is that below this limit, the fill factor, FF, becomes too small for the conversion efficiency to be practical.

Now, the heterojunction photovoltaic cell provided by this invention will be described specifically below. In one typical construction, the cell is composed of a transparent electrode - p type amorphous semiconductor - i type a-Si - n type a-Si - electrode, with the transparent electrode side designed to be exposed to the incident light. The transparent electrode is desirably formed of ITO or $SnO_2$, preferably the latter. It may be formed by having this substance vacuum deposited on a glass substrate or by having the substance directly vacuum deposited on the p type amorphous semiconductor.

The p type amorphous semiconductor on the side of the cell exposed to the incident light is desired to have a thickness in the range of from about 30 Å to 300 Å, preferably from 50 Å to 200 Å. Although the thickness of the i type a-Si layer is not specifically limited in the cell of this invention, it is generally selected within the range of from about 2500 Å to 10,000 Å. The n type a-Si layer whose primary function is to establish ohmic contact has no particular thickness limitation. Generally, the thickness of this layer is selected in the range of from about 150 Å to 600 Å. Optionally, this n type a-Si layer may be substituted by an n type amorphous semiconductor of this invention.

In another typical construction, the cell is composed of a transparent electrode - n type amorphous semiconductor - i type a-Si - p type a-Si - electrode, with the transparent electrode side to be exposed to the incident light. The n type amorphous semiconductor on the side of the cell exposed to the incident light desirably has a thickness in the range of from about 30 Å to 300 Å, preferably from 50 Å to 200 Å. Although the thickness of the i type a-Si is not specifically limited, it is generally selected in the range of from about 2500 Å to 10,000 Å. The thickness of the p type a-Si layer, which is not particularly limited either, is generally selected in the range of from about 150 Å to 600 Å. Optionally, this p type a-Si layer may be substituted by a p type amorphous semiconductor of the present invention. The material for the transparent electrode and the method for the vacuum deposition thereof are the same as described above.

Now, the effect of this invention will be described below with reference to working examples. Glow discharge decomposition was performed at a high frequency of 14.56 MHz in a quartz test tube having an inside diameter of 11 cm. An i type a-Si layer was obtained by subjecting silane diluted with hydrogen to the glow discharge decomposition at 2 to 10 Torrs. An n type a-Si layer was obtained similarly by subjecting silane diluted with hydrogen and phosphine ($PH_3$) ($PH_3/SiH_4 = 0.5$ mol %) to a glow discharge decomposition. A p type a-$Si_{1-y}N_y$ layer was obtained similarly by subjecting silane, ammonia ($NH_3$) and diborane ($B_2H_6$) [B/Si+N] = 0.50 atom %] to a glow discharge decomposition. In this case, the gas composition involved in the glow discharge decomposition was adjusted so that the atomic fraction y in the formula, $a\text{-}Si_{1-y}N_y$, would fall in the range of from 0.75 to 0.05.

A solar cell was constructed by successively depositing the p type $a\text{-}Si_{1-y}N_y$, the i type a-Si and the n type a-Si in the order mentioned on the $SnO_2$ surface of a glass substrate coated with an $SnO_2$ film of 25 $\Omega/\square$ and finally vacuum depositing aluminum of 3.3 mm². This solar cell was tested for cell properties by use of a solar simulator of AM-1 (100 mW/cm²). During the glow discharge, the temperature of the substrate was kept at 250° C. The thickness of the i layer was 5000 Å, that of the n layer 500 Å, and that of the p type $a\text{-}Si_{1-y}N_y$ layer 135 Å.

The solar cell properties vs. varying compositions of the p type $a\text{-}Si_{1-y}N_y$ film are shown in Table 1. It is seen from this table that the conversion coefficient (hereinafter represented by "$\eta$") which is 4.6% for the layer formed solely of silane ($Si_1N_0$) is increased to 5.45%, 6.5% and 6.75 respectively when the value of "y" in the formula, $a\text{-}Si_{1-y}N_y$, of this invention is 0.05, 0.20 and 0.40, indicating that the n type amorphous semiconductor of this invention permits a conspicuous improvement in the value of $\eta$. It should be noted here that while the increase in the short-circuit current, Jsc, is naturally expected from the fact that the optical band gap of the $a\text{-}Si_{1-y}N_y$ is greater than that of the a-Si, the increase in the open voltage, Voc, is quite beyond expectation. The conspicuous improvement in the conversion efficiency attained by this invention is due solely to the simultaneous improvement in these two factors.

The conversion efficiency begins to show a sign of decline as the value of "y" exceeds 0.5, because the increase in the resistance offered by the p type $a\text{-}Si_{1-y}N_y$ reaches a point where the fill factor (hereinafter referred to as FF) falls. In the meantime the short-circuit current (hereinafter referred to as Jsc) and the open voltage (hereinafter referred to as Voc) remain substantially unaffected. The fulfillment of the requirements of $a\text{-}Si_{1-y}N_y$ is believed to lower the absorption loss of light in the p layer and enhance Jsc and Voc to an extent enough to permit the conspicuous improvement in the conversion efficiency.

Entirely the same results were obtained when $SiF_4$ and $NH_3$ were used instead.

Figure 3:
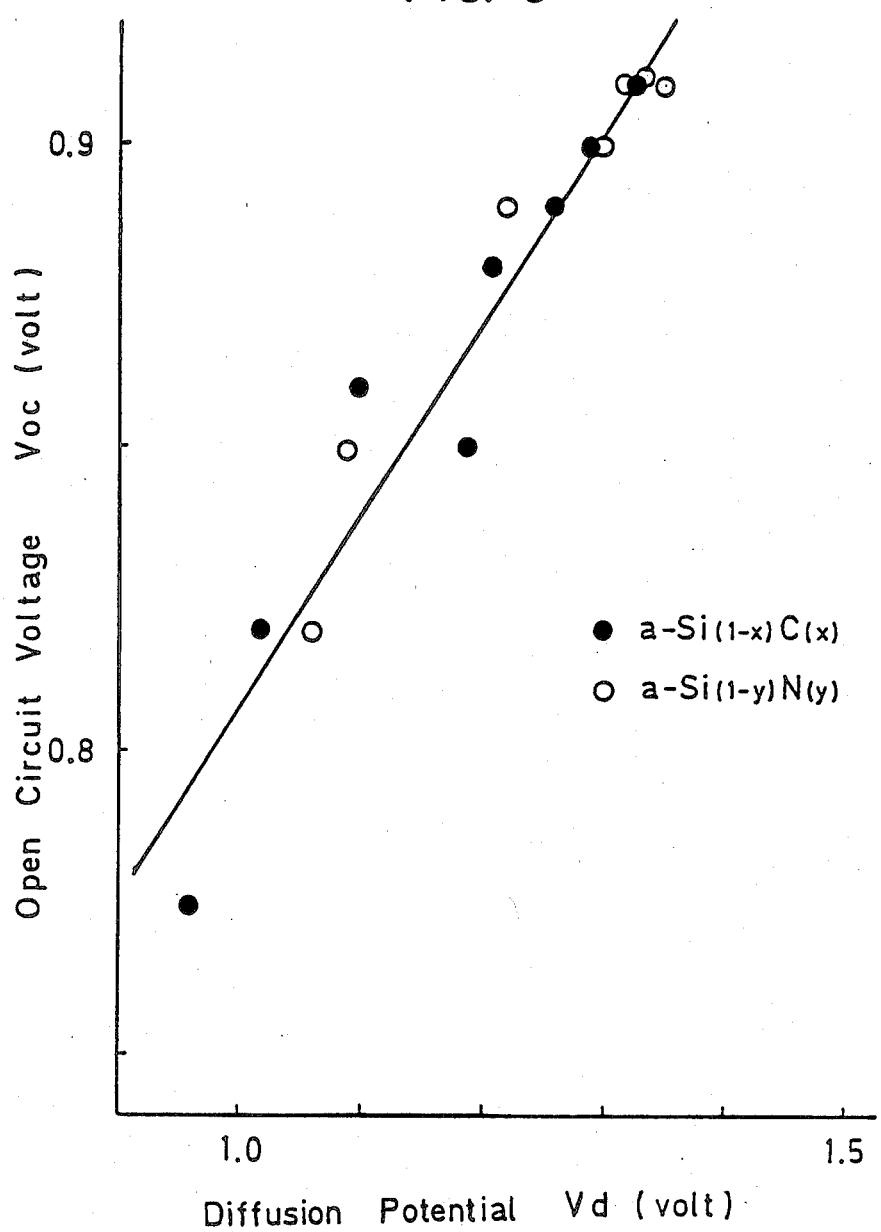
FIG. 3 is a graph showing the relation between the diffusion potential, Vd, and the open circuit voltage as obtained with the p type amorphous semiconductor on the window side.

Now, the p type $a\text{-}Si_{1-x}C_x$ cells will be described. The p type amorphous semiconductor $a\text{-}Si_{1-x}C_x$ in a varying composition was obtained by subjecting silane diluted with hydrogen, methane ($CH_4$) and diborane [B/(Si+C)=0.1 atom %] to the aforementioned glow discharge decomposition. The solar cell properties vs. varying compositions of the p type $a\text{-}Si_{1-x}C_x$ are shown in Table 2. The results reveal the conspicuous improvement brought about in Jsc and Voc values. The values of the optical band gap, Eg.opt, of the $a\text{-}Si_{1-x}C_x$ and the $a\text{-}Si_{1-y}N_y$ are greater than the value of a-Si as shown in Tables 1, 2. Use of these amorphous semiconductors as window materials, therefore, is naturally expected to bring about an improvement in the Jsc properties. Moreover, it brings about an unexpected conspicuous improvement in the Voc properties, which leads to a great enhancement of the conversion efficiency. The reason therefor evidently exists in the relation between the diffusion potential, Vd, and Voc, which plots in one straight line without reference to the type of the amorphous semiconductor to be used, as shown in FIG. 3. This means that the value of Voc linearly increases in proportion to the increase of Vd. This fact indicates that the diffusion potential is enhanced and Voc is proportionately improved by using an amorphous semiconductor of a large optical band gap as the material for the window of the pin junction photovoltaic cell.

As described above, this invention has issued from the discovery that the heterojunction photovoltaic cell which uses as the window material the amorphous semiconductor having an Eg.opt of at least about 1.85 eV and a pin junction diffusion potential, Vd, of at least 1.1 volts enjoys a conspicuous improvement in not only Jsc but also Voc. Surprisingly, this effect of the invention does not depend on the type of the amorphous semiconductor. The effect described above is entirely the same when the n type amorphous semiconductor of the cell is exposed to the incident light.

TABLE 1

| | p type $a\text{-}Si_{(1-y)}N_{(y)}$/i-n a-Si:H | | | | | | | | |
|---|---|---|---|---|---|---|---|---|---|
| Atomic Fraction (y) | | 0 | 0.05 | 0.10 | 0.20 | 0.30 | 0.40 | 0.50 | 0.70 |
| Eg. opt (eV) | | 1.76 | 1.81 | 1.85 | 1.92 | 2.01 | 2.11 | 2.20 | 2.27 |
| Electric Conductivity $(\Omega \cdot cm)^{-1}$ | | $5 \times 10^{-7}$ | $4 \times 10^{-7}$ | $5 \times 10^{-7}$ | $5 \times 10^{-7}$ | $3 \times 10^{-7}$ | $2 \times 10^{-7}$ | $1 \times 10^{-7}$ | $8 \times 10^{-8}$ |
| Ef-Ev (eV) | | 0.6 | 0.55 | 0.56 | 0.50 | 0.51 | 0.56 | 0.67 | 0.75 |
| Vd (volts) | | 0.96 | 1.06 | 1.09 | 1.22 | 1.30 | 1.35 | 1.33 | 1.32 |
| Solar Cell Properties | Jsc (mA/cm²) | 10.3 | 10.8 | 11.2 | 11.6 | 11.9 | 12.15 | 12.1 | 12.2 |
| | Voc (volts) | 0.75 | 0.82 | 0.85 | 0.89 | 0.90 | 0.91 | 0.91 | 0.91 |
| | FF | 0.60 | 0.615 | 0.62 | 0.63 | 0.62 | 0.61 | 0.59 | 0.57 |
| | $\eta$(%) | 4.6 | 5.45 | 5.9 | 6.5 | 6.6 | 6.75 | 6.50 | 6.30 |

TABLE 2

| | p type $a\text{-}Si_{(1-x)}C_x$/i-n a-Si:H | | | | | | | | |
|---|---|---|---|---|---|---|---|---|---|
| Atomic Fraction (x) | | 0 | 0.05 | 0.1 | 0.2 | 0.3 | 0.4 | 0.5 | 0.7 | 0.85 |
| Eg. opt (eV) | | 1.76 | 1.80 | 1.85 | 1.95 | 2.06 | 2.10 | 2.11 | 2.10 | 2.09 |
| Electric Conductivity $(\Omega \cdot cm)^{-1}$ | | $5 \times 10^{-7}$ | $7 \times 10^{-7}$ | $7 \times 10^{-7}$ | $1 \times 10^{-6}$ | $8 \times 10^{-7}$ | $6 \times 10^{-7}$ | $3 \times 10^{-7}$ | $2 \times 10^{-7}$ | $9 \times 10^{-8}$ |
| Ef-Ev (eV) | | 0.6 | 0.58 | 0.55 | 0.54 | 0.57 | 0.57 | 0.65 | 0.65 | 0.70 |
| Vd (volts) | | 0.96 | 1.02 | 1.10 | 1.21 | 1.29 | 1.33 | 1.26 | 1.25 | 1.19 |
| Solar Cell Properties | Jsc (mA/cm²) | 10.0 | 10.3 | 10.8 | 11.5 | 11.9 | 12.0 | 12.1 | 12.0 | 11.9 |
| | Voc (volts) | 0.75 | 0.82 | 0.86 | 0.88 | 0.90 | 0.91 | 0.89 | 0.885 | 0.85 |
| | FF | 0.61 | 0.64 | 0.68 | 0.70 | 0.67 | 0.66 | 0.66 | 0.62 | 0.58 |

TABLE 2-continued

| p type a-Si$_{(1-x)}$C$_x$/i-n a-Si:H | | | | | | | | |
|---|---|---|---|---|---|---|---|---|
| η(%) | 4.6 | 5.4 | 6.3 | 7.1 | 7.18 | 7.2 | 7.1 | 6.6 | 5.9 | i 1-Si:H Eg. opt = 1.8eV
Ec-Ef = 0.85eV
n type a-Si:H Eg. opt = 1.8eV
Ec-Ef = 0.2eV

What is claimed is:

1. A p-i-n amorphous silicon type photovoltaic cell, characterized by incorporating as either the p or n type side thereof exposed to the incident light an amorphous semiconductor having an optical band gap, Eg.opt, of not less than about 1.85 eV, an electric conductivity of not less than about $10^{-8}$ $(\Omega.cm)^{-1}$ at 20° C. and a p-i-n junction diffusion potential, Vd, of not less than about 1.1 volts.

2. The p-i-n amorphous silicon type photovoltaic cell according to claim 1, wherein the p or n type amorphous semiconductor is made of a substance represented by the general formula a-Si$_{1-x}$C$_x$ or a-Si$_{1-y}$N$_y$ respectively.

3. The p-i-n amorphous silicon type photovoltaic cell according to claim 2, wherein the amorphous semiconductor satisfies the relationship of $0.05 < x < 0.8$ or $0.05 < y < 0.8$ with respect to the general formula involved.

4. A p-i-n amorphous silicon type photovoltaic cell according to claim 3 wherein the p or n side opposite the side exposed to light is also formed of said amorphous semiconductor material.

5. A p-i-n amorphous silicon type photovoltaic cell according to claim 1 in which the amorphous semiconductor exposed to the incident light is a p type semiconductor of the general formula a-Si$_{1-x}$C$_x$ in which x satisfies the relationship $0.05 < x < 0.8$.

6. A p-i-n amorphous silicon type photovoltaic cell according to claim 5 in which both the intrinsic layer and n type layer of the photovoltaic cell are made of amorphous silicon.

7. A p-i-n amorphous silicon type photovoltaic cell according to claim 1 in which the amorphous semiconductor exposed to the incident light is an n type semiconductor of the general formula a-Si$_{1-x}$C$_x$ in which x satisfies the relationship $0.05 < x < 0.8$.

8. A p-i-n amorphous type silicon photovoltaic cell according to claim 7 in which both the intrinsic layer and the p type layer of the photovoltaic cell are made of amorphous silicon.

9. A p-i-n amorphous silicon type photovoltaic cell according to claim 1 in which the amorphous semiconductor exposed to the incident light is a p type semiconductor of the general formula a-Si$_{1-y}$N$_y$ in which y satisfies the relationship of $0.05 < y < 0.8$.

10. A p-i-n amorphous silicon type photovoltaic cell according to claim 9 in which both the intrinsic layer and n type layer of the photovoltaic cell are made of amorphous silicon.

11. A p-i-n amorphous silicon type photovoltaic cell according to claim 1 in which the amorphous semiconductor exposed to the incident light is an n type semiconductor of the general formula a-Si$_{1-y}$N$_y$ in which y satisfies the relationship of $0.05 < y < 0.8$.

12. A p-i-n amorphous type silicon photovoltaic cell according to claim 11 in which both the intrinsic layer and the p type layer of the photovoltaic cell are made of amorphous silicon.

13. A p-i-n amorphous silicon type voltaic cell according to claim 1 in which the p or n side opposite the side exposed to the incident light is made of a-Si$_{1-x}$C$_x$ or a-Si$_{1-y}$N$_y$, respectively, wherein x and y satisfy the relationship of $0.05 < x < 0.8$ and $0.05 < y < 0.8$.

* * * * *